United States Patent [19]

Hara et al.

[11] 3,952,261

[45] Apr. 20, 1976

[54] SIGNAL DETECTION CIRCUIT

[75] Inventors: Takao Hara; Yukio Murayama, both of Kawasaki, Japan

[73] Assignee: Fujitsu Ltd., Kawasaki, Japan

[22] Filed: Apr. 18, 1975

[21] Appl. No.: 569,541

Related U.S. Application Data

[63] Continuation of Ser. No. 410,170, Oct. 26, 1973, abandoned.

[30] Foreign Application Priority Data

Nov. 6, 1972 Japan.............................. 47-110962

[52] U.S. Cl................................. 331/1 R; 331/12; 331/25
[51] Int. Cl.²........................................ H03B 3/04
[58] Field of Search.................. 331/1 R, 17, 18, 25, 331/11, 12; 329/50, 111, 122, 124, 125

[56] References Cited
UNITED STATES PATENTS 3,440,540   4/1969   Hane et al. ..................... 329/122 X
3,564,434   2/1971   Camenzind et al. ................ 329/122

*Primary Examiner*—Siegfried H. Grimm
*Attorney, Agent, or Firm*—Daniel Jay Tick

[57]  ABSTRACT

A signal detection circuit for determining synchronism and asynchronism in a phase synchronization circuit having a loop consisting of a first phase detector, a loop filter and a voltage controlled oscillator, has a second phase detector for input signals of the phase synchronization circuit and output signals of the voltage controlled oscillator. The output of the second phase detector is supplied to a low pass filter and a level judgment circuit. The level judgment circuit includes a Schmitt trigger circuit with two threshold levels due to hysteresis effect to reduce misjudgments when the input signals are low signal to noise signals.

2 Claims, 8 Drawing Figures

LEVEL JUDGMENT CIRCUIT

SIGNAL DETECTION CIRCUIT

This is a continuation of application Ser. No. 410,170, filed Oct. 26, 1973 for Signal Detection Circuit, and now abandoned.

BACKGROUND OF THE INVENTION

The present invention relates to a signal detection circuit. More particularly, the invention relates to a signal detection circuit for indicating synchronism. The invention relates to a signal detection circuit which identifies with less and reduced misjudgments, the condition of synchronism in a phase synchronization circuit having a loop consisting of a phase detector, a loop filter and a voltage controlled oscillator.

A conventional measure for identifying the condition of synchronism and asynchronism or the existence of signals in a phase synchronization circuit utilizes a synchronism establishing signal detection circuit, as hereinafter described. In a phase synchronization circuit having a phase detector, a loop filter and a voltage controlled oscillator, the phase of the output oscillations of the voltage controlled oscillator is synchronized with the phase of the input signals by controlling the voltage controlled oscillator with the difference between the phase of the input signals and the phase of the output oscillations. A second phase detector is added to the circuit. Output signals of the voltage controlled oscillator fed through a 90° phase shifter and the input signals of the phase synchronization circuit are fed to the second phase detector. A level judgment circuit comprising a low pass filter and a comparator or differential amplifier is connected to the output of the second phase detector and provides synchronism indicating signals from the output of the second phase detector.

In the known synchronism indicating signal detection circuit, the output of the low pass filter shows a characteristic of saturation starting from 0 to 1 when the phase synchronization circuit is pulled in at the input signal phase. Therefore, by setting a specific judgment level between 0 level and 1 level in the level judgement circuit, the condition of synchronism, asynchronism and the presence of signals are identified.

The known synchronism idicating signal detection circuit has a disadvantage, however. The disadvantage is that when low signal to noise signals, that is, signals with noise, are supplied as the input signals of the phase synchronization circuit, the level judgment circuit becomes unstable for level regulation due to the noise and the probability of misjudgment becomes high.

The principal object of the invention is to provide a signal detection circuit having less and reduced misjudgments in determining synchronism and asynchronism.

An object of the invention is to provide a signal detection circuit of simple structure having a level judgement circuit having less and reduced misjudgments in determining synchronism and asynchronism of a phase synchronization circuit.

Another object of the invention is to provide a signal detection circuit which functions with efficiency, effectiveness and reliability to indicate synchronism and asynchronism conditions of a phase synchronization circuit with minimal misjudgments or misdeterminations.

BRIEF SUMMARY OF THE INVENTION

In accordance with the invention, a signal detection circuit for indicating the condition of synchronism of a phase synchronization circuit having a first phase detector, a loop filter and a voltage controlled oscillator connected in series between input means for supplying input signals thereto and output means for deriving output signals therefrom, comprises a level judgment circuit having two threshold levels and coupling means coupling the level judgment circuit between the input means and the output means.

The coupling means comprises a second phase detector having one input connected to the input means and another input coupled to the output means and an output coupled to the level judgment circuit.

The level judgment circuit comprises a Schmitt trigger circuit.

The level judgment circuit comprises hysteresis means for providing two threshold levels.

The coupling means further comprises a 90° phase shifter connected between the output means and the other input of the second phase detector and a low pass filter connected between the output of the second phase detector and the level judgment circuit.

The level judgment circuit has an output for providing signals indicative of the condition of synchronization of the phase synchronization circuit.

BRIEF DESCRIPTION OF THE DRAWINGS

In order that the invention may be readily carried into effect, it will now be described with reference to the accompanying drawings, wherein.

In the figures, the same components are identified by the same reference numerals.

DETAILED DESCRIPTION OF THE INVENTION

Figure 1:
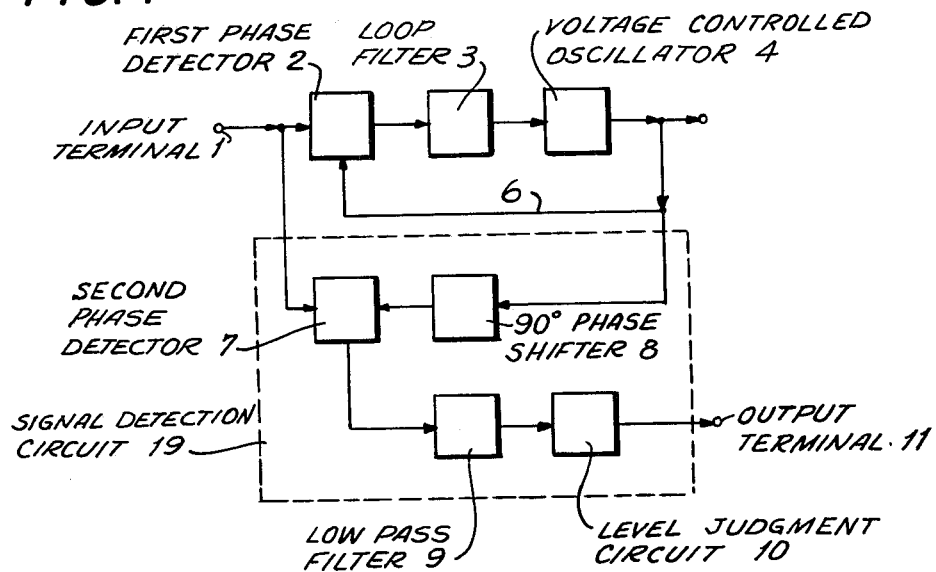
FIG. 1 is a block diagram of an embodiment of the signal detection circuit of the invention.

FIG. 1 illustrates an embodiment of the signal detection circuit of the invention for indicating synchronism. In FIG. 1, the phase synchronization circuit comprises a loop wherein an input signal is fed through an input terminal 1 to a first phase detector 2 which produces an output proportional to the input signal phase $\theta i$. The output signal of the first phase detector 2 is fed through a loop filter 3 to a voltage controlled oscillator 4. The output of the voltage controlled oscillator 4 is supplied to an output terminal 5 and is fed back to the first phase detector 2 via a feedback circuit 6 to control the voltage controlled oscillator, so that output phase $\theta_o$ is made to coincide with the input phase $\theta_i$.

A signal detection circuit 19 is connected to the phase synchronization circuit for determining synchronism and asynchronism in the phase synchronization circuit. The signal detection circuit comprises a second phase detector 7 having one input coupled to the output terminal 5 via a 90° phase shifter 8 and another input connected to the input terminal 1. The second phase detector 7 and the 90° phase shifter are connected in a loop. The detection output of the second phase detector 7 is fed through a low pass filter 9 to a level judgment circuit 10.

In accordance with the invention, the level judgment circuit 10 comprises a Schmitt trigger or equivalent circuit with two threshold levels. The output of the level judgment circuit 10 is provided at an output terminal 11 and indicates the condition of synchronism and asynchronism of the phase synchronization circuit. In the signal detection circuit of the invention for determining synchronism, the input signal supplied to the input terminal 1 should be a modulation-free wave. The circuit of FIG. 1 is the same as the conventional circuit, except that the level judgment circuit of the known circuit comprises a comparator, and so on, having one threshold level, whereas that of the invention comprises a circuit having two threshold levels or judgment levels.

The operation of a known level judgment circuit 10 consisting of a comparator in determining synchronism is as follows. The phase difference $\Delta\theta$ between the input phase $\theta_i$ and the output phase $\theta_o$ has a characteristic of attenuation starting from a specific level 1 to 0 level due to operation of the phase synchronization circuit. The circuit including the 90° phase shifter 8 and the second phase detector 7 has a characteristic shifted by 90°, that is, a characteristic of saturation starting from 0 level to 1 level. The detection of a specific judgment level through the low pass filter 9 from the detection output of the second phase detector 7 by the comparator of the level judgment circuit 10 therefore enables the stage of synchronism to be identified. Synchronism can be confirmed by the setting of a level near the level 1 of the saturation characteristic and asynchronism and the presence of signals can be identified by the setting of an appropriate level.

Figure 2A:
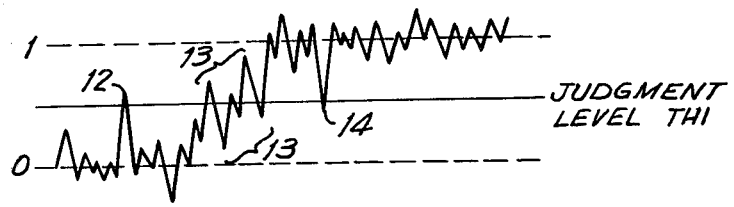
FIG. 2a is a graphical presentation of noise in a level judgment circuit known in the art.
Figure 2B:
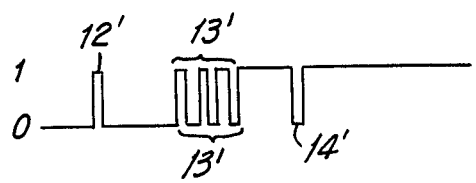
FIG. 2b is a graphical presentation of pulses generated by a level judgment circuit known in the art.

If low signal to noise signals, or signals with noise, are fed to the input of the circuit, however, the level judgment circuit 10 is liable to be defective because of the noise. As shown in FIGS. 2a and 2b, the phenomenon is caused by the increase of the peak of noise above the judgment level TH1 at the 0 level stage, or by the decrease of the peak of noise below the judgment level at the 1 level stage. As shown in FIGS. 2a and 2b, the noise peak 12 rises above the judgment level TH1 at the 0 level, generating a pulse 12', and the noise peak 14 decreases below the judgment level TH1 att the 1 level, generating a pulse 14', while noise peaks 13 and pulses 13' form a mixed portion.

Figure 3A:
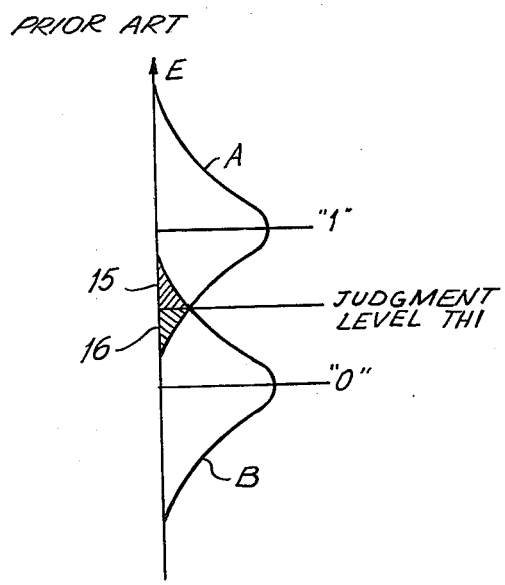
FIG. 3a is a graphical presentation of level misjudgment in a level judgment circuit known in the art at 0 and 1 noise levels at a specific judgment level.
Figure 3B:
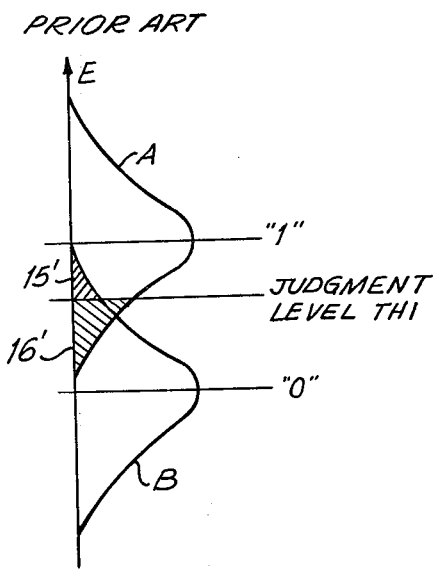
FIG. 3b is a graphical presentation of level misjudgment in a level judgment circuit known in the art at 0 and 1 noise levels at a different judgment level.

The deficiency of the aforedescribed phenomenon cannot be eliminated by a variation of the judgment level. This is because if the phase difference of the output voltage characteristic of the second phase detector 7 of FIG. 1 is supposed to have a linear characteristic, the distributions concerning the levels of noise at the 1 level and the 0 level are expressed by the curves shown in FIGS. 3a and 3b. In FIGS. 3a and 3b, shaded portions 15 and 15' show probabilities of level misjudgment by noise at the 0 level and shaded portions 16 and 16' show probabilities of level misjudgment by noise at the 1 level. If the judgment level TH1 in FIG. 3b is raised from that in FIG. 3a, the shaded portion 15' becomes smaller in comparison with 15, while the shaded portion 16' becomes larger in comparison with 16, with the total probability of misjudgment being increased.

We have found that the utilization of a judgment circuit having two judgment levels or threshold levels depending upon the direction of variation, that is, by the hysteresis characteristic, is a very effective measure in reducing or lessening misjudgments of level and of the condition of synchronism and asynchronism.

Conventionally, it is well known that a Schmitt trigger circuit has hysteresis in the exciting level against input signals, or that it has a difference between the threshold level in a transition from 0 level to 1 level and in a transition from 1 level to 0 level. Efforts have been made to reduce such difference, since it is regarded as a disadvantage. In accordance with the invention, the difference between the two threshold levels is positively utilized to considerably reduce the aforedescribed level misjudgements.

Figure 4:
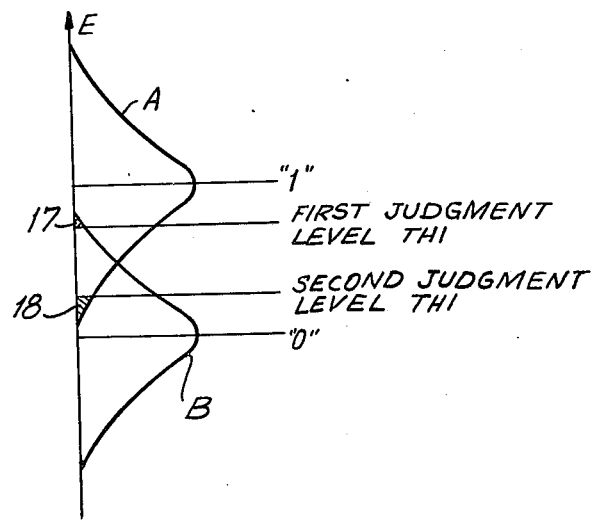
FIG. 4 is a graphical presentation of level misjudgment in the level judgment circuit of the invention at 0 and 1 noise levels.

In FIG. 4, the curves A and B show the level distributions of noise at 1 level and 0 level, as in FIG. 3. A first judgment level TH1 is for a transition from 0 level to 1 level and a second judgment level TH2 is for a transition from 1 level to 0 level in the level judgment circuit of the invention. The probabilities of misjudgment at the 1 level and the 0 level are shown by the shaded portions 17 and 18, respectively. These misjudgment probabilities indicate a considerable reduction or lessening in misjudgment relative to those shown in FIGS. 3a and 3b.

Figure 5:
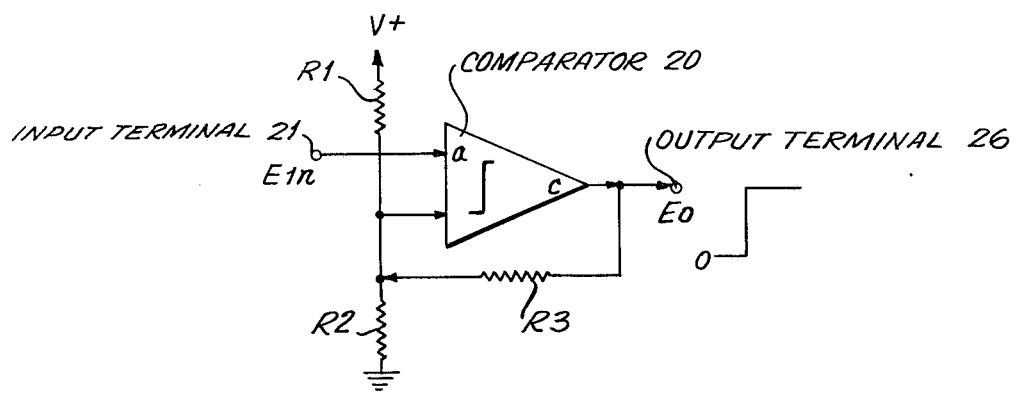
FIG. 5 is a circuit diagram of an embodiment of the level judgement circuit of the invention.

FIG. 5 is a circuit diagram of an embodiment of the level judgment circuit of the invention. The input signal voltage $Ein$ to be tested is fed to a comparator 20 through an input terminal 21. The output voltage $Eo$ is provided at an output terminal 26. In FIG. 5, the level relations of the input and output are inverse. With the input at the 1 level, the output is arranged to be at the 0 level. Then, a reference voltage E1 to be a judgment level is derived from a constant positive voltage $V^+$ at a point 22 in the common connection between a resistor R1 and a resistor R2 connected in series between a source of voltage $V^+$ and a point at ground potential. The reference voltage E1 is applied to the comparator 20. A feedback circuit is connected from the output terminal 25 through a resistor R3 to the judgment level input point 22.

Figure 6:
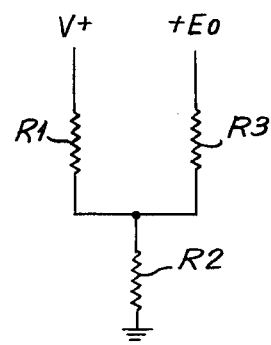
FIG. 6 is a circuit diagram of the equivalent circuit of FIG. 5 when E$in$ is 0.

If it is assumed that $Ein$ is 0, the output is 1, that is, $Eo$. If the output impedance of the comparator 20 is very low in comparison with the resistance value of the resistor R3, the equivalent circuit of FIG. 5 is approximated as shown in FIG. 6 and E1 is $$E1 = \frac{V^+ R2R3 + E0R1R2}{R1R2 + R2R3 + R3R1} \tag{1}$$

The magnitude of the reference voltage E1 remains unchanged until the comparator 20 is inverted. This magnitude becomes the judgment level TH1 in the transition from 0 level to 1 level.

In the transition from the 1 level to the 0 level, the judgment level TH2 is $$E2 = \frac{V^+ R2R3}{R1R2 + R2R3 + R3R1} \qquad (2)$$

Both judgment levels TH1 and TH2 are functions of the resistors R1, R2 and R3, and by fixing any one of these resistors and adjusting the other two, each judgment level can be set at a required magnitude.

As hereinbefore explained, in a signal detection circuit for identifying the condition of synchronism of a phase synchronization circuit connected thereto, the utilization of a level judgment circuit with two threshold levels by hysteresis permits a considerable reduction in the probability of misjudgment to the 1 level at the 0 level and in the probability of misjudgment to the 0 level at the 1 level by setting the two judgment level magnitudes at required values, considerably decreasing the overall misjudgments to permit reliable identification of the condition of synchronism and asynchronism and the presence of signals having low signal to noise ratios.

Although the foregoing explanation is with reference to the embodiment in FIG. 1, it is particularly understood that the present invention is not limited thereto or thereby. Although the input signals to the phase synchronization circuit are supposed to be of modulation-free wave in FIG. 1, for input signals of $n$ phase modulated wave, for example, the phase synchronization circuit comprises a circuit of a reverse-modulation system or multiplier system, and so on, known in the art, and the signal detection circuit comprises means for supplying the $n$ phase modulation signals and the output of the voltage controlled oscillator of the phase synchronization circuit to the input of a phase detector, the output of which is fed through an $n$ multiplier circuit to the level judgment circuit.

The components of the signal detection circuit of the invention not illustrated herein are known and may comprise any suitable known circuitry.

While the invention has been described by means of a specific example and in a specific embodiment, I do not wish to be limited thereto, for obvious modifications will occur to those skilled in the art without departing from the spirit and scope of the invention.

We claim:

1. A signal detection circuit for indicating the condition of synchronism of a phase synchronization circuit having a loop consisting of a first phase detector, a loop filter and a voltage controlled oscillator and connected in series between input means for supplying input signals thereto and output means for deriving output signals therefrom, said signal detection circuit comprising a level judgment circuit having hysteresis characteristics for providing two threshold levels depending upon the direction of variation thereby reducing misjudgments of synchronism when low signal to noise signals are supplied to the input means of the phase synchronization circuit; and coupling means coupling the level judgment circuit between the input means and the output means, the coupling means comprising a second phase detector having one input connected to the input means and another input coupled to the output means and an output coupled to the level judgment circuit, a 90° phase shifter connected between the output means and the other input of the second phase detector and a low pass filter connected between the output of the second phase detector and the level judgment circuit thereby providing a synchronization condition qualification signal for the phase synchronization circuit.

2. A signal detection circuit as claimed in claim 1, wherein the level judgment circuit comprises a Schmitt trigger circuit.

* * * * *